United States Patent [19]

Kibler et al.

[11] Patent Number: 5,296,310
[45] Date of Patent: Mar. 22, 1994

[54] HIGH CONDUCTIVITY HYDRID MATERIAL FOR THERMAL MANAGEMENT

[75] Inventors: John J. Kibler, Lansdale; Thomas G. Cassin, Prospectville, both of Pa.

[73] Assignee: Materials Science Corporation, Blue Bell, Pa.

[21] Appl. No.: 836,130

[22] Filed: Feb. 14, 1992

[51] Int. Cl.$^5$ ............................ H05K 7/20; B32B 3/00
[52] U.S. Cl. .................................. 428/614; 428/634; 257/720; 361/717; 361/707
[58] Field of Search ............... 428/614, 634, 588, 594, 428/654; 174/252; 165/185, 905; 361/386, 387, 388

[56] References Cited

U.S. PATENT DOCUMENTS

| | | | |
|---|---|---|---|
| 2,820,751 | 1/1958 | Saller | 428/614 |
| 3,328,642 | 6/1967 | Haumesser et al. | 361/387 |
| 3,427,706 | 2/1969 | Jaffee | 428/594 |
| 3,616,115 | 10/1971 | Klummek | 428/614 |
| 3,678,995 | 7/1972 | Collard | 428/614 |
| 4,372,804 | 2/1983 | Hanabusa et al. | 156/631 |
| 4,482,912 | 11/1984 | Chiba et al. | 426/614 |
| 4,536,435 | 8/1985 | Utsumi et al. | 428/209 |
| 4,578,308 | 3/1986 | Hani et al. | 428/297 |
| 4,601,941 | 7/1986 | Lutz et al. | 428/213 |
| 4,615,945 | 10/1986 | Iida | 428/335 |
| 4,640,065 | 2/1987 | Harris et al. | 428/74 |
| 4,675,246 | 6/1987 | Kundlinger et al. | 428/336 |
| 4,878,152 | 10/1989 | Sauzade et al. | 361/386 |
| 4,888,247 | 12/1989 | Zweben et al. | 428/105 |
| 4,990,402 | 2/1991 | Kneringer et al. | 228/122 |
| 4,996,115 | 2/1991 | Eerkes et al. | 425/614 |
| 4,996,116 | 2/1991 | Webster et al. | 428/627 |
| 5,039,577 | 8/1991 | Knoell et al. | 428/614 |

*Primary Examiner*—John Zimmerman
*Attorney, Agent, or Firm*—Ratner & Prestia

[57] ABSTRACT

A hybrid structural material combines high thermal conductivity and pre-determined mechanical properties compatible with adjacent or attached materials. It has three elements: (1) a non-structural, high thermal conductivity core material which defines the thermal conductivity of the hybrid structural material; (2) a pair of face sheets, which form opposing surfaces of the hybrid structural material and help to define its mechanical properties, disposed on opposite sides of the core material to create a face sheet-core material-face sheet sandwich construction; and (3) a frame substantially surrounding the core material and bonded to the face sheets for helping to define (along with the face sheets) the mechanical properties of the hybrid structural material.

The interfaces between the face sheets and the core material allow physical contact, but prevent structural interaction, between the face sheets and the core material. Consequently, the hybrid structural material achieves a high fraction of the thermal conductivity of the core material while maintaining the thermal expansion (and other mechanical properties) of the face sheets and frame.

21 Claims, 1 Drawing Sheet

HIGH CONDUCTIVITY HYBRID MATERIAL FOR THERMAL MANAGEMENT

This invention was made with Government support under Contract Number N00024-88-C-5712 awarded by Naval Sea Systems Command, Department of the Navy. The Government has certain rights in the invention.

FIELD OF THE INVENTION

The present invention relates generally to high conductivity structural materials and, more particularly, to a hybrid construction which incorporates both a nonstructural material to provide high-conductivity and a separate material to control thermal expansion and mechanical properties such as stiffness.

BACKGROUND OF THE INVENTION

Heat dissipating plate and shell structures having desirable combinations of thermal conductivity, thermal expansion, and stiffness are in great demand for critical electronic applications. Good thermal conductivity is required to permit heat transfer away from high density electronic components and devices such as integrated circuits. The heat generated in electronic components causes high temperatures and requires, in many cases, that heat sinks be used to remove the heat from the electronic element or component. When heat sinks are not used, various other devices have been designed for direct attachment to a heat dissipating plate which, in turn, will act as the heat transfer element.

Moreover, the rapidly increasing density of integrated circuits, large-scale integrated circuits, power diodes, and the like has prompted growing requirements to satisfy more and more severe thermal conditions. Consequently, heat dissipating structures have undergone continuous improvements as the electronic industry has developed.

When the electronic components are attached to a heat dissipating structure, even one of the more advanced structures available today to provide good thermal conductivity, the different coefficients of thermal expansion of the various elements often cause problems. For example, the heat sink and the electrically insulating substrate, to which the electronic component is attached, may have different coefficients of thermal expansion. Similarly, different coefficients may exist between the electronic component and the heat sink.

When there is a significant difference in coefficients of thermal expansion between components, temperature changes arising from soldering and heat generated in the systems during operation can cause large thermal stresses due to the differences in relative growth of the materials. Such stresses may cause, in turn, premature component failure leading to reduced component reliability.

Metals such as aluminum and copper are most frequently used as heat dissipating structures because they have good thermal conductivity. The coefficients of thermal expansion of such materials are so high, however, that heat or cold will cause the premature failure of the electronic elements—an electronic element is usually made from a material with a lower coefficient of thermal expansion.

Efforts to produce a low expansion alloy, such as Invar, have led to materials with low thermal expansions, but which sacrifice thermal conductivity and density.

Semiconductors and other critical elements used in electrical components, circuits, or systems, such as silicon and gallium arsenide, are brittle, have low coefficients of thermal expansion, and generate considerable waste heat in operation. Consequently, the minimum requirements for heat transfer devices for these components in electronic systems are a low coefficient of thermal expansion and a high thermal conductivity.

No single monolithic metal has a low coefficient of thermal expansion and a high thermal conductivity. Composite materials made from various substrates and organic polymer materials, such as laminates made of a paper substrate and a phenolic resin or a fiber substrate of glass and epoxy resin, as well as ceramic materials such as alumina plates, have been used as substrates for printed wiring boards and heat sinks. The prior art suggests, however, that such substrate materials are defective because they have low thermal conductivity.

Other laminates have been developed which include a metal base and an organic polymeric material or metal-ceramic composite plates, such as an electrical insulating alumilite film formed on an aluminum plate. These laminates are inadequate, however, either because the organic polymeric material causes thermal resistance or because the alumilite film is subject to cracking. Moreover, the foregoing materials have coefficients of thermal expansion which are incompatible with that of the plate.

High conductivity structural materials have been created by placing high conductivity fibers (or particles) in a binder or matrix material. Plates of high conductivity and controlled thermal expansion are achieved by placing the fibers in preferred directions. The oriented fibers yield, however, anisotropic properties unless they are placed in several directions. In more conventional cases, combinations of layers of different materials are used to provide both good conductivity and controlled thermal expansion. However, panel thermal conductivities are often sacrificed to yield desirable thermal expansion properties in many cases.

U.S. Pat. No. 4,888,247 (Zweben et al.) discloses a specific, laminated heat conducting device. At least one layer of metal (aluminum) is bonded to at least one layer of polymer matrix composite material (epoxy resin). A low thermal expansion reinforcing material (graphite fibers) is distributed throughout and embedded in the polymer matrix composite material. In one embodiment, a plurality of alternating layers of metal and reinforced polymer matrix composite material form the device. The coefficient of thermal expansion and the thermal conductivity of the device are defined by the metal in the laminate in combination with the polymer matrix material and the reinforcing material within the polymer matrix material.

Thus, Zweben et al. focus on fiber reinforced resin matrix materials with layers of metal. The purpose of the combination is to use the metal for its high conductivity properties and the composite layers to restrain the thermal expansion of the metal so that the expansion of the composite is compatible with adjacent materials. As is typical of attempts to obtain a combination of properties by forming a composite of laminated layers, each material or layer in a plane interacts fully with the layers around it. Zweben et al. specifically disclose that the metal layer is bonded to the polymer matrix composite material. Such interaction requires a compromise in conductivity properties in order to achieve desired structural properties.

To overcome the shortcomings of existing low-thermal expansion, high-thermal conductivity structures, a new hybrid construction is provided. One object of the present invention is to provide a structure which has a high thermal conductivity for transferring heat generated by electronic components and systems.

A match between the coefficient of thermal expansion of adjacent components in electronic devices is critical because it prevents structural and electrical failure during thermal cycling over the operational range of the components. Accordingly, another object of the present invention is to provide an improved structure which can be tailored to match the coefficient of thermal expansion of adjacent elements.

A structure which combines both high conductivity and a low coefficient of thermal expansion which can be tailored to provide desirable mechanical properties (e.g., strength and stiffness) is a further object. It is still another object of the present invention to provide a structure which has controlled properties in different directions, including in-plane isotropic properties as one special case.

SUMMARY OF THE INVENTION

To achieve these and other objects, and in view of its purposes, the present invention provides a hybrid structural material combining high thermal conductivity and pre-determined mechanical and thermal expansion properties. The hybrid structural material has three elements (1) a non-structural, high thermal conductivity core material which defines the thermal conductivity of the hybrid structural material; (2) a pair of face sheets which form opposing surfaces of the hybrid structural material and help to define the mechanical properties of the hybrid structural material, the first of the face sheets disposed on one side of the core material and the second of the face sheets disposed on the opposite side of the core material to create a face sheet-core material-face sheet sandwich construction; and (3) a frame substantially surrounding the core material and either bonded to or integral with the face sheets for helping to define (along with the face sheets) the mechanical properties of the hybrid structural material and for providing the proper interaction between the face sheets and the core.

A first interface between the first face sheet and the core material provides physical contact, but limits shear transfer across the interface between the first face sheet and the core material. Similarly, a second interface between the second face sheet and the core material allows physical contact, but limits the shear transfer across the interface between the second face sheet and the core material. Consequently, the hybrid structural material achieves a high fraction of the thermal conductivity of the core material while maintaining the thermal expansion (and other mechanical properties) of the face sheets and frame.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing, in which.

DETAILED DESCRIPTION OF THE INVENTION

Figure 1:
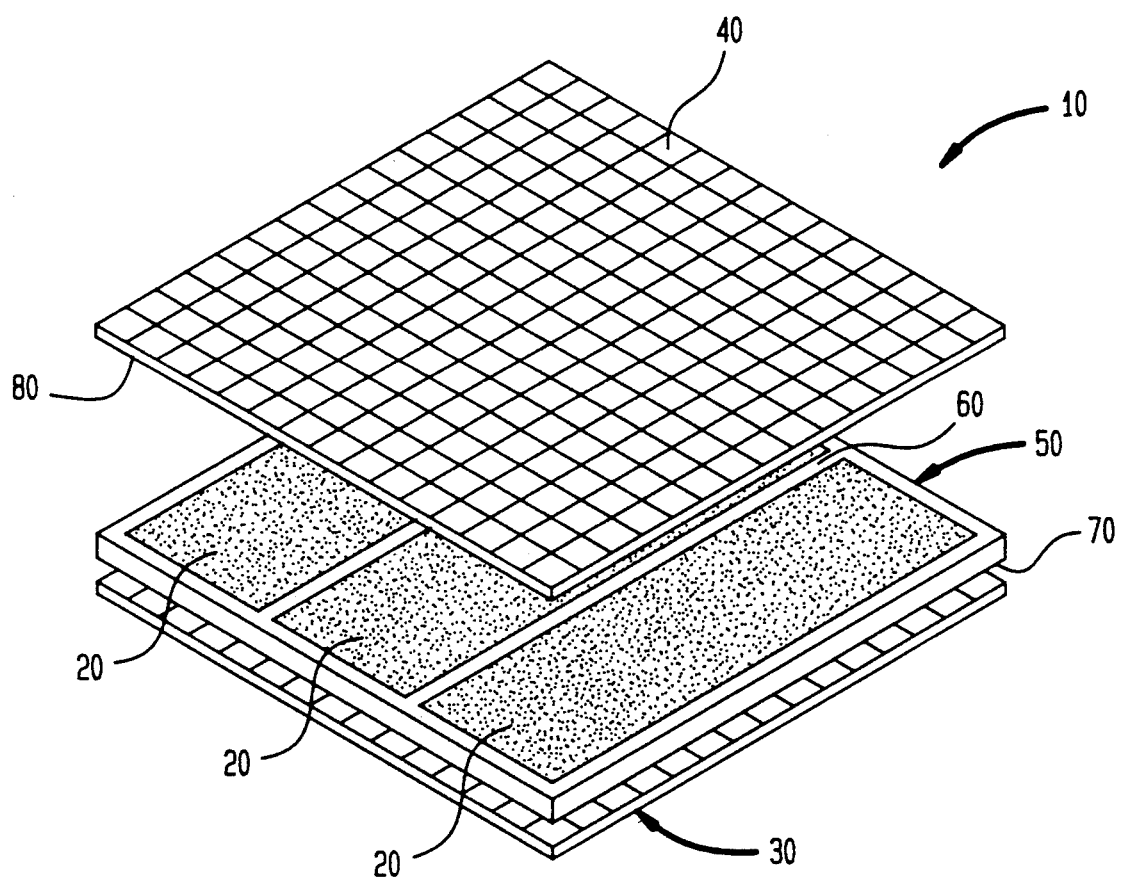
FIG. 1 is a perspective view of the hybrid structure having high conductivity and controlled thermostructural properties according to the present invention.

Referring to the drawing, FIG. 1 shows the hybrid structure 10 of the present invention. Hybrid structure 10 is a sandwich construction. A core material 20 is placed between two face sheets 30, 40. A frame 50 substantially surrounds core material 20 and, in this example, is bonded or otherwise attached to face sheets 30, 40.

Core material 20 has a very high thermal conductivity and need not have significant strength or stiffness. Any high conductivity material can be used for its conductivity properties as core material 20—regardless of its structural properties. Materials which have high conductivity in more than one direction in the plane can be used. In-plane isotropic materials such as highly ordered pyrolytic graphite, compression annealed pyrolytic graphite (CAPG), synthetic diamond, composites using these materials, or the like are suitable.

Because CAPG has been fabricated and tested, it is preferable at this time. CAPG is desirable because it has the same thermal conductivity properties in both in-plane directions and, therefore, will conduct heat well in both directions. In contrast, fiber reinforced materials require fibers to be placed in at least two directions in order to obtain a balance of properties in the in-plane directions.

First face sheet 30 and second face sheet 40 form the surface skins of hybrid structure 10. Face sheets 30, 40 are in physical contact with core material 20 both at the first interface 70 between first sheet 30 and core material 20 and at the second interface 80 between second sheet 40 and core material 20. Face sheets 30, 40 do not, however, interact structurally with core material 20. (That is, although normal stress may be transferred across first interface 70 and second interface 80, only very low shear stresses are transferred.) It is important that a bond between face sheets 30, 40 and core material 20 be avoided; in fact, chemical treatment may be used during the assembly process to prevent such a bond.

Face sheets 30, 40 help to define the mechanical properties, such as stiffness, and the thermal expansions of hybrid structure 10. A variety of materials are possible for face sheets 30, 40. Any compatible material with sufficient temperature range capability for a particular application can be used. Because the thermal expansions of face sheets 30, 40 and frame 50 are the primary controlling factors in defining the plane thermal expansion of hybrid structure 10, the material chosen for face sheets 30, 40 should meet the system thermal expansion requirements (typically, low thermal expansion). Good conducting materials are also excellent candidates for face sheets 30, 40.

Matrix materials reinforced with fibers, particles, or whiskers are suitable for face sheets 30, 40. Graphite fiber reinforced aluminum materials have been demonstrated and are suitable. Specifically, Amoco's P120 pitch-based graphite fibers in an aluminum matrix have been fabricated and tested and are preferred, therefore, at this time.

Frame 50 substantially surrounds, fully encloses the edges, and encapsulates core material 20 and is bonded to face sheets 30, 40. Any corrosion problems which might develop between core material 20 and face sheets 30, 40 can be reduced by providing a good seal around frame 50. Proper diffusion bonding (e.g., by hot pressing) of face sheets 30, 40 to frame 50 will create such a seal. For many configurations, the one assembly may be integrally fabricated.

Like face sheets 30, 40, frame 50 helps to define the mechanical properties, such as stiffness, and the thermal expansion of hybrid structure 10. A variety of materials are possible for frame 50. A monolithic aluminum alloy is preferable at this time because it has been fabricated and tested.

Because core material 20 is not structurally integral with face sheets 30, 40, the thermal expansion and stiffness of hybrid structure 10 are determined by face sheets 30, 40 and frame 50 alone. The materials used to form face sheets 30, 40 and frame 50 are important factors in that determination. Also important are the thicknesses of each face sheet 30, 40 and of frame 50.

One embodiment of frame 50 is shown in FIG. 1, in which frame 50 has multiple ribs 60 extending in the heat flow direction. Ribs 60 foster the structural properties of hybrid structure 10 by permitting face sheets 30, 40 to be tied through ribs 60. Full length slots along the plane further enhance thermal dissipation by allowing asymmetrical placement of heat generating components. Core material 20 should be continuous in the heat flow path; therefore, core material 20 should not be broken up into small squares. Such squares would require heat to flow into and out of core material 20 several times, thus increasing thermal resistance and reducing thermal conductivity.

Although core material 20 is not structurally integral with face sheets 30, 40, it is important that physical contact between core material 20 and face sheets 30, 40 be maintained at interfaces 70, 80. Good heat transfer across interfaces 70, 80 is necessary.

Moreover, interfaces 70, 80 should transfer high normal compressive stress but only very low shear stresses. Normally, the high modulus core material 20 would restrain the thermal growth of face sheets 30, 40 and greatly alter the composite thermal expansion of hybrid structure 10. One advantage of a CAPG core material 20 is that core material 20 does not structurally interact with face sheets 30, 40 and the poor shear properties of core material 20 allow face sheets 30, 40 to slide over core material 20 during expansion (on heating) or contraction (on cooling). That sliding process occurs in the outer layers of core material 20. Consequently, the planar structural behavior of hybrid structure 10 is largely independent of core material 20.

By hot pressing face sheets 30, 40 to frame 50 and carefully selecting both the expansion coefficients and the thicknesses of core material 20, face sheets 30, 40, and frame 50, a differential thermal expansion is maintained between core material 20 and frame 50. The result is that core material 20 is in slight compression after fabrication of hybrid structure 10. Such compression helps to maintain physical contact between core material 20 and face sheets 30, 40 and, thereby, to assure thermal contact between core material 20 and face sheets 30, 40. In turn, that thermal contact allows heat to flow into core material 20 and to be conducted in core material 20 toward the ends of the plane of hybrid structure 10, where it can be removed through face sheets 30, 40 into a heat sink (not shown). Core material 20 does not influence the thermal expansion or other mechanical properties of hybrid structure 10; core material 20 does interact with heat in face sheets 30, 40 to conduct that heat away to a heat sink.

The in-plane properties of hybrid structure 10 are independently defined by core material 20 and the combination of face sheets 30, 40 and frame 50. Hybrid structure 10 achieves a high fraction of the thermal conductivity of core material 20 while maintaining the thermal expansion (and other mechanical properties) of face sheets 30, 40 and frame 50. Desirable mechanical properties for hybrid structure 10 can be controlled by selecting suitable face sheets 30, 40 and frame 50 with minimal concern for thermal conductivity. In sum, hybrid structure 10 uses one material as the dominant method to control thermal conductivity (core material 20) and other materials (and their geometries) as the dominant method to control mechanical properties (face sheets 30, 40 and frame 50).

The independent sources of the various properties for hybrid structure 10 avoid compromising those properties and expand the scope of usable materials. CAPG has excellent thermal properties and is relatively inexpensive. CAPG cannot itself be used as a thermal plane material, however, because it has poor structural properties and a negative thermal expansion coefficient. When laminated in a conventional multi-layer laminate structure with alternating aluminum layers, CAPG simply debonds. But CAPG is an excellent material for use in hybrid structure 10 as core material 20.

Conventional, high-conductivity, graphite-reinforced composites can have in-plane thermal conductivities on the order of 300 W/m-k. CAPG can be produced with conductivity approaching 1900 W/m-k. Accordingly, the in-plane conductivity of hybrid structure 10 approaches about 1500 W/m-k. Such conductivity is obtained while hybrid structure 10 maintains the necessary thermal expansion characteristics for critical electronic applications and the structural properties needed to provide structural support.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. For example, although thermal expansion has been highlighted as the mechanical property to be controlled independently of the choice of core material 20, other properties, such as stiffness or surface condition, can also be controlled. Other objectives can be achieved, such as high electrical conductivity in a structure having dimensional stability requirements, using the concept of the present invention.

What is claimed is:

1. A hybrid structural material for thermal management including heat gathering and heat removal and allowing independent tailoring of mechanical properties, thermal expansion characteristics, and thermal conductivities, said hybrid structural material comprising:

a non-structural, high thermal conductivity core material defining the thermal conductivity of said hybrid structural material;

a pair of face sheets forming opposing surfaces of said hybrid structural material and helping to define the mechanical properties of said hybrid structural material, the first of said face sheets disposed on one side of said core material and the second of said face sheets disposed on the opposite side of said core material to create a face sheet-core material-face sheet sandwich construction;
a first interface between said first face sheet and said core material allowing physical contact between said first face sheet and said core material and allowing said first face sheet to slide over said core material on heating and cooling;
a second interface between said second face sheet and said core material allowing physical contact between said second face sheet and said core material and allowing said second face sheet to slide over said core material on heating and cooling; and
a frame substantially surrounding said core material and attached, by one of bonding to and integrally forming with, said face sheets for helping to define the mechanical properties of said hybrid structural material.

2. A hybrid structural material according to claim 1 wherein said hybrid structural material is adapted to mount electronic components and transfer heat generated by the electronic components.

3. A hybrid structural material according to claim 1 wherein said core material has an in-plane isotropic thermal conductivity greater than 1400 W/m-k.

4. A hybrid structural material according to claim 3 wherein said core material is compression annealed pyrolytic graphite.

5. A hybrid structural material according to claim 1 wherein said core material is not in structural interaction with said frame and said face sheets.

6. A hybrid structural material according to claim 1 wherein said face sheets are graphite reinforced aluminum.

7. A hybrid structural material according to claim 6 wherein said face sheets are pitch-based graphite fibers in an aluminum matrix.

8. A hybrid structural material according to claim 1 wherein said frame is a monolithic aluminum alloy.

9. A hybrid structural material according to claim 1 wherein said frame is bonded to said face sheets by diffusion.

10. A hybrid structural material according to claim 1 wherein said frame is integral with said face sheets.

11. A hybrid structural material according to claim 1 wherein said frame has multiple ribs.

12. A hybrid structural material according to claim 11 wherein said ribs provide only a structural connection between said face sheets.

13. A hybrid structural material according to claim 1 wherein said core material is in slight compression to assure physical contact between said face sheets and said core material.

14. A hybrid structural material for mounting electronic components and transferring heat generated by the electronic components and combining high thermal conductivity and mechanical properties independently selected to be compatible with adjacent electronic components, said hybrid structural material comprising:
a non-structural, high thermal conductivity core material chosen from the group consisting of highly ordered pyrolytic graphite, compression annealed pyrolytic graphite, and synthetic diamond, having an in-plane isotropic thermal conductivity greater than 750 W/m-K, and defining the thermal conductivity of said hybrid structural material;
a pair of face sheets forming opposing surfaces of said hybrid structural material and helping to define the mechanical properties of said hybrid structural material, the first of said face sheets disposed on one side of said core material and the second of said face sheets disposed on the opposite side of said core material to create a face sheet-core material-face sheet sandwich construction;
a first interface between said first face sheet and said core material allowing physical contact between said first face sheet and said core material and sallowing said first face sheet to slide over said core material on heating and cooling;
a second interface between said second face sheet and said core material allowing physical contact between said second face sheet and said core material and allowing said second face sheet to slide over said core material on heating and cooling; and
a frame substantially surrounding said core material and bonded to said face sheets for helping to define the mechanical properties of said hybrid structural material.

15. A hybrid structural material according to claim 14 wherein said core material is compression annealed pyrolytic graphite.

16. A hybrid structural material according to claim 14 wherein said face sheets are graphite reinforced aluminum.

17. A hybrid structural material according to claim 16 wherein said face sheets are pitch-based graphite fibers in an aluminum matrix.

18. A hybrid structural material according to claim 14 wherein said frame is a monolithic aluminum alloy.

19. A hybrid structural material according to claim 14 wherein said frame is bonded to said face sheets by diffusion.

20. A hybrid structural material according to claim 14 wherein said frame has multiple ribs.

21. A hybrid structural material according to claim 14 wherein said core material is in slight compression to assure physical contact between said face sheets and said core material at said first and second interfaces.

* * * * *